(12) United States Patent
Mickle et al.

(10) Patent No.: US 7,722,920 B2
(45) Date of Patent: May 25, 2010

(54) METHOD OF MAKING AN ELECTRONIC DEVICE USING AN ELECTRICALLY CONDUCTIVE POLYMER, AND ASSOCIATED PRODUCTS

(75) Inventors: Marlin H. Mickle, Pittsburgh, PA (US); James T. Cain, Pittsburgh, PA (US); Michael R. Lovell, Wexford, PA (US); Jungfeng Mei, New Stanton, PA (US)

(73) Assignee: University of Pittsburgh-Of the Commonwealth System of Higher Education, Pittsburgh, PA (US)

( * ) Notice: Subject to any disclaimer, the term of this patent is extended or adjusted under 35 U.S.C. 154(b) by 906 days.

(21) Appl. No.: 11/430,718

(22) Filed: May 9, 2006

(65) Prior Publication Data

US 2006/0267200 A1 Nov. 30, 2006

Related U.S. Application Data

(60) Provisional application No. 60/680,730, filed on May 13, 2005.

(51) Int. Cl.
*B05D 5/12* (2006.01)

(52) U.S. Cl. ............ 427/96.1; 427/97.3; 427/97.5; 427/97.6; 427/98.3; 427/99.4

(58) Field of Classification Search ........... 427/96.1, 427/97.3, 97.5, 97.6, 98.3, 99.4
See application file for complete search history.

(56) References Cited

U.S. PATENT DOCUMENTS

| | | | |
|---|---|---|---|
| 4,029,380 A | 6/1977 | Yonkers | |
| 4,566,186 A | 1/1986 | Bauer et al. | |
| 4,670,347 A | 6/1987 | Lasik et al. | |
| 4,783,646 A | 11/1988 | Matsuzaki | |
| 4,849,765 A | 7/1989 | Marko | |
| 5,420,596 A | 5/1995 | Burrell et al. | |
| 5,531,020 A | 7/1996 | Durand et al. | |
| 5,566,441 A | 10/1996 | Marsh et al. | |
| 6,080,264 A | 6/2000 | Ball | |
| 6,091,332 A | 7/2000 | Eberhardt et al. | |
| 6,147,662 A | 11/2000 | Grabau et al. | |
| 6,289,237 B1 | 9/2001 | Mickle et al. | |
| 6,291,568 B1 | 9/2001 | Lussey | |
| 6,328,196 B1 | 12/2001 | Imanishi et al. | |
| 6,410,415 B1 | 6/2002 | Estes et al. | |
| 6,501,663 B1 | 12/2002 | Pan | |
| 6,615,074 B2 | 9/2003 | Mickle et al. | |
| 6,838,989 B1 | 1/2005 | Mays et al. | |
| 6,856,291 B2 | 2/2005 | Mickle et al. | |
| 6,870,516 B2 | 3/2005 | Aisenbrey | |

(Continued)

*Primary Examiner*—Binh X Tran
(74) *Attorney, Agent, or Firm*—Eckert Seamans et al.; Philip E. Levy, Esq.

(57) ABSTRACT

Described are methods of making an electronic device, such as an RFID tag, including fabricating an antenna by depositing an electrically conductive polymer onto a substrate. The electrically conductive polymer is electrically connected to an electronic component, such as an IC chip or a diode. The electronic component may be placed on the substrate before or after the electrically conductive polymer is deposited. Once deposited, the electrically conductive polymer is cured. The electrically conductive polymer may be deposited in a number of ways, such using a mask having a desired pattern and applying the electrically conductive polymer to the mask, by screen printing the electrically conductive polymer or by printing the electrically conductive polymer using ink jet printing techniques.

38 Claims, 10 Drawing Sheets

U.S. PATENT DOCUMENTS

| | | |
|---|---|---|
| 6,876,905 B2 | 4/2005 | Farley et al. |
| 6,876,951 B2 | 4/2005 | Skidmore et al. |
| 7,051,429 B2 * | 5/2006 | Kerr et al. .................. 29/825 |
| 7,446,663 B2 * | 11/2008 | Rowe, Jr. ................. 340/572.7 |
| 2002/0036237 A1 * | 3/2002 | Atherton et al. ............ 235/492 |
| 2002/0124392 A1 * | 9/2002 | Chung ........................ 29/739 |
| 2004/0169086 A1 * | 9/2004 | Ohta et al. .................. 235/492 |
| 2004/0189473 A1 | 9/2004 | Mickle et al. |
| 2004/0200061 A1 * | 10/2004 | Coleman et al. ............. 29/825 |
| 2004/0259604 A1 | 12/2004 | Mickle et al. |
| 2005/0030181 A1 | 2/2005 | Mickle et al. |
| 2007/0106017 A1 * | 5/2007 | Kessel et al. ................ 524/589 |

* cited by examiner

METHOD OF MAKING AN ELECTRONIC DEVICE USING AN ELECTRICALLY CONDUCTIVE POLYMER, AND ASSOCIATED PRODUCTS

CROSS-REFERENCE TO RELATED APPLICATION

This application claims the benefit of U.S. Provisional Application No. 60/680,730, entitled "Method Of Making An Electronic Device Using An Electrically Conductive Polymer And Associated Products," which was filed on May 13, 2005, the disclosure of which is incorporated herein by reference.

BACKGROUND OF THE INVENTION

1. Field of the Invention

The present invention relates to the manufacture of electronic devices, and in particular to the manufacture of an electronic device that includes an electronic component such as an integrated circuit chip electrically connected to an antenna, such as a radio frequency identification (RFID) tag, using an electrically conductive polymer.

2. Description of the Prior Art

The use of radio frequency identification (RFID) systems is expanding rapidly in a wide range of application areas. RFID systems consist of radio frequency tags or transponders (RFID tags) and radio frequency readers or interrogators (RFID readers). The RFID tags include an integrated circuit (IC) chip, such as a complementary metal oxide semiconductor (CMOS) chip, or some other electronic component and an antenna connected to the IC chip for communicating with an RFID reader over an air interface by way of RF signals. For ease of description and illustrative purposes, an IC chip is shown herein in connection with certain particular embodiments, but is should be appreciated that other electronic components, such as diodes, may also be used without departing from the scope of the present invention. Specifically, in a typical RFID system, one or more RFID readers query the RFID tags for information stored on them, which can be, for example, identification numbers, user written data, or sensed data. RFID systems have thus been applied in many application areas to track, monitor, report and manage items as they move between physical locations.

A number of RFID and related systems are known in the art. For example, U.S. Pat. Nos. 6,289,237 and 6,615,074, both entitled "Apparatus for Energizing a Remote Station and Related Method," owned by the assignee hereof, describe a system where a remote station, such as an RFID tag, has a conversion device for energizing the remote station responsive to receipt of energy transmitted from a base station, such as an RFID reader. In addition, U.S. Pat. No. 6,856,291, entitled "Energy Harvesting Circuits and Associated Methods," also owned by the assignee hereof, describes an antenna having a circuit for harvesting energy transmitted in space that may form part of an RFID tag. United States Patent Application Publication Nos. 20040189473 and 20040259604, both entitled "Recharging Method and Associated Apparatus," and 20050030181, entitled "Antenna On A Wireless Untethered Device Such As A Chip Or Printed Circuit Board For Harvesting Energy From Space," each describe various embodiments of a system and method for remotely energizing a remote station, such as an RFID tag, having an antenna having an effective area that is larger than it's physical area through the use of RF energy from a base station, such as an RFID reader, ambient energy or ultra-wide band energy. The antenna in such a system may be provided on an integrated circuit chip, such as a monolithic chip, or on a printed circuit board with a suitable substrate.

The IC chip and antenna components of an RFID tag are typically manufactured separately, often at different locations and by different entities. The IC chip and antenna components are then shipped to a manufacturing location where the RFID tags are assembled by attaching an IC chip and an antenna to a substrate, such as non-conducting polymer, plastic, paper, mylar, linen, gauze, FR-4 glass/epoxy laminate or the like, and electrically connecting the IC chip to the antenna. The IC chip typically includes a number of conductive pads, often made of aluminum, that are provided on a surface thereof which serve as points of contact for the electrical connections to the antenna. These points of contact may be on the order of 50 microns square or less. Thus, it is important for the IC chip connection points (the pads) and the corresponding points on the antenna to be aligned with one another before making a connection, which often proves to be difficult. Thus, there is a need for a method of manufacturing an RFID tag or similar electrical component that simplifies the connection of an IC chip to an antenna and the connection of the IC chip and antenna to a substrate.

SUMMARY OF THE INVENTION

In one embodiment, the present invention relates to a method of making an electronic device, such as an RFID tag, including steps of placing an electronic component, such as an IC chip or a non-linear device like a diode, on a substrate, wherein a first surface of the electronic component contacts a top surface of the substrate. The electronic component also has a second, opposite surface having one or more points of contact, such as aluminum pads, provided thereon. Next, the method includes depositing an electrically conductive polymer on a portion of the second surface and the substrate in a first pattern such that the electrically conductive polymer in the first pattern contacts at least one of the one or more points of contact and curing the electrically conductive polymer in the first pattern, wherein the electrically conductive polymer in the first pattern forms an antenna. The depositing step may include placing a mask having a cut-out portion in the shape of the first pattern over the substrate and the electronic component, and applying the electrically conductive polymer to the mask. Alternatively, the depositing step may include screen printing the electrically conductive polymer in the first pattern, or printing the electrically conductive polymer in the first pattern using an ink jet print head.

Furthermore, the method may also include the formation of a capacitor by depositing a layer of dielectric material in a second pattern on top of at least a portion of the electrically conductive polymer in the first pattern, and depositing an electrically conductive polymer in a third pattern on top of at least a portion of the layer of dielectric material, the electrically conductive polymer in the third pattern contacting at least one of the one or more points of contact. In this case, the curing step further includes curing the electrically conductive polymer in the third pattern.

In an alternative embodiment, the present invention relates to a method of making an electronic device, such as an RFID tag, including steps of depositing an electrically conductive polymer on a substrate in a first pattern and placing an electronic component, such as an IC chip or a non-linear device like a diode, on the substrate. The electronic component includes a first surface having one or more points of contact provided thereon, at least one of the one or more points of contact contacting a portion of the electrically conductive polymer. The method further includes curing the electrically conductive polymer in the first pattern, wherein the electrically conductive polymer in the first pattern forms an antenna. The depositing step may include placing a mask having a cut-out portion in the shape of the first pattern over the substrate and applying the electrically conductive polymer to said mask. Alternatively, the depositing step may include screen printing the electrically conductive polymer in the first pattern or printing the electrically conductive polymer in the first pattern using an ink jet print head.

In addition, the method may also include the formation of a capacitor by depositing a layer of dielectric material in a second pattern on top of at least a portion of the electrically conductive polymer in the first pattern and depositing an electrically conductive polymer in a third pattern on top of at least a portion of the layer of dielectric material, at least one of said one or more points of contact contacting the electrically conductive polymer in the third pattern. The curing step then further comprises curing the electrically conductive polymer in the third pattern.

In yet another alternative embodiment, the present invention relates to a method of making an antenna that includes steps of providing a flexible substrate, depositing an electrically conductive polymer on the flexible substrate in a first pattern, and curing the electrically conductive polymer in the first pattern, wherein the electrically conductive polymer in the first pattern forms the antenna. The first pattern may include a spiral pattern. Also, the flexible substrate may be, at least partially, in the form of a sheet having a length, in which case the method further includes repeating the depositing step a plurality of times along the length to produce a plurality of additional patterns of the conductive polymer. Then, the curing step further includes curing the additional patterns of the conductive polymer. The method in this embodiment may further include rolling the substrate up following the curing step.

The present invention also relates to various products made using the methods described herein.

It is an object of this invention to provide a simplified method of making an electronic device, such as an RFID tag, that includes an antenna and an electronic component such as an IC chip or diode.

It is a further object of this invention to provide a simplified method of fabricating an antenna and attaching the antenna to a substrate and/or an electronic component such as an IC chip or diode.

It is a still further object of this invention to provide a simplified method of fabricating an antenna on a flexible substrate.

It is a still further object of this invention to provide an electronic device having an electronic component and antenna fabricated from a conductive polymer.

It is a still further object of this invention to provide a flexible electronic device having an antenna fabricated from a conductive polymer with an appropriate sheet resistance.

BRIEF DESCRIPTION OF THE DRAWINGS

These and other advantages of the present invention will become readily apparent upon consideration of the following detailed description and attached drawings, wherein.

DESCRIPTION OF THE PREFERRED EMBODIMENTS

Several electrically conductive polymer materials, sometimes referred to as polymer-based conductive inks, are currently known. For example, one such polymer is described in U.S. Pat. No. 6,291,568, entitled "Polymer Composition," the disclosure of which is incorporated herein by reference. The present invention solves many of the problems associated with the manufacture of RFID tags or similar electronic devices having an IC chip connected to an antenna by utilizing an electrically conductive polymer to fabricate the antenna, make the required connections between the antenna and the IC chip, and at least partially, if not wholly, attach the antenna and the IC chip to a substrate, such as, without limitation, non-conducting polymer, plastic, paper, mylar, linen, gauze, FR-4 glass/epoxy laminate or the like. The present invention may, for this purpose, employ any known or hereafter developed electrically conductive polymer or like material that has: (i) sufficient adhesion properties to enable it to adhere to the appropriate contact points on the IC chip and to the substrate, and (ii) sufficient electrical/conductive properties to enable it to function as an antenna for the particular application in question. Ideally, the sheet resistance or conductance of the electrically conductive polymer will be as good as a pure metal, such as copper, silver or aluminum. Preferably, the sheet resistance of the electrically conductive polymer is about 1.0 ohm/square or less, and most preferably 0.5 ohm/square or less. In one embodiment, the sheet resistance of the electrically conductive polymer is in the range of about 1.0 ohm/square to 0.1 ohm/square. In another embodiment, the sheet resistance of the electrically conductive polymer is in the range of about 0.1 ohm/square to about 0.01 ohm/square. In another yet another embodiment, the sheet resistance of the electrically conductive polymer is in the range of about 0.01 ohm/square to about 0.001 ohm/square. In still another embodiment, the sheet resistance of the electrically conductive polymer is in the range of about 0.001 ohm/square to about 0.0001 ohm/square. In still another embodiment, the sheet resistance of the electrically conductive polymer is less than about 0.0001 ohm/square.

Figure 1:
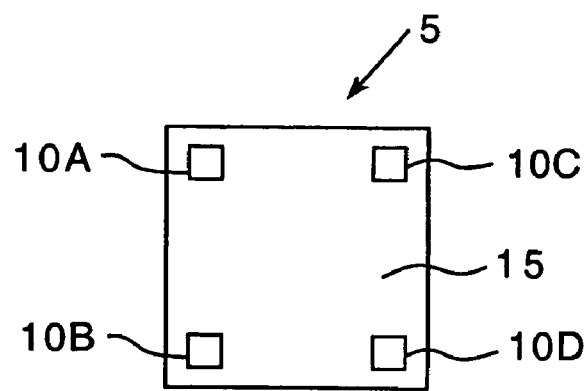
FIG. 1 is a bottom plan view of an exemplary IC chip that may form a part of an RFID tag or other electronic device fabricated in accordance with the present invention.

FIG. 1 is a bottom plan view of an exemplary IC chip 5 that may form a part of an RFID tag or other electronic device. IC chip 5 includes pads 10A, 10B, 10C and 10D on the bottom surface 15 thereof. Pads 10A, 10B, 10C and 10D are connected to the internal circuitry of the IC chip 5 and provide contact points for electrical connections to be made to an antenna and/or other external circuitry. In particular embodiments, the IC chip 5 may be a CMOS device and/or the pads may be made of aluminum.

Figure 2:
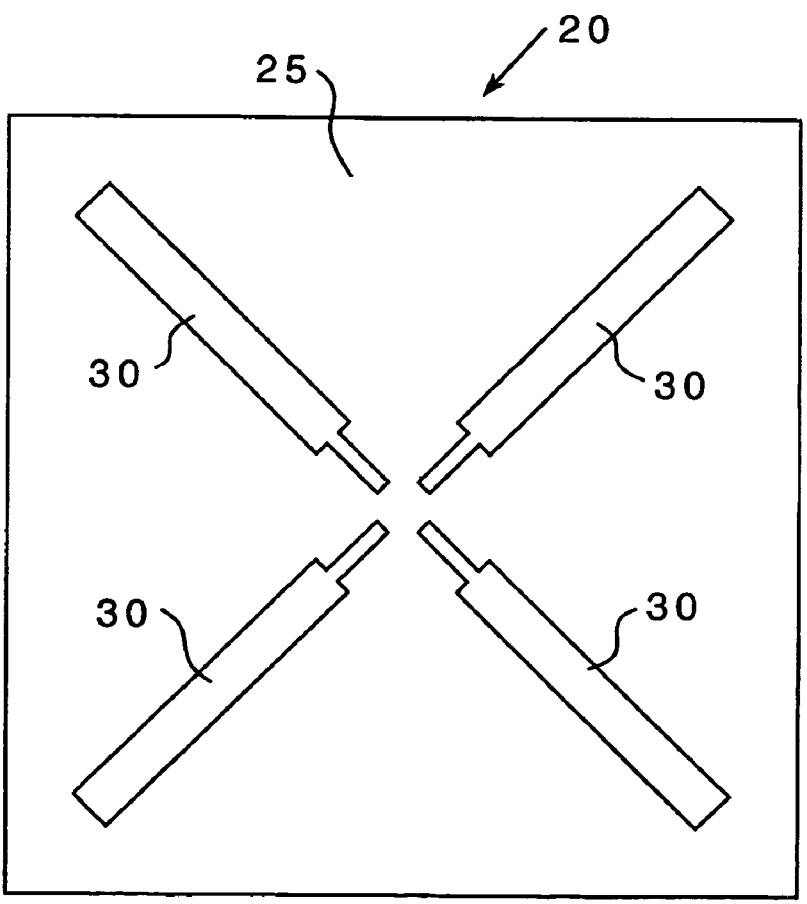
FIG. 2 is a top plan view of a mask used in one embodiment of a method of manufacturing an electronic device such as an RFID tag according to the present invention.

FIG. 2 is a top plan view of a mask 20 used in one embodiment of a method of manufacturing an electronic device such as an RFID tag according to the present invention. Mask 20 includes a solid portion 25 made of, for example, thin metal sheet stock, magnetic film, plastic, paper or any other suitable material, and a cut-out portion 30, which may include two or more separate sections as shown in FIG. 2. As is known in the art, a mask such as mask 20 may be used to selectively apply a material to one or more surfaces placed thereunder. In particular, the cut-out portion 30 allows the material in question to pass through the mask 20 and defines a desired pattern for deposition of the material in question onto the one or more surfaces, and the solid portion 25 prevents the material in question from passing through the mask 20. In the present invention, the cut-out portion 30 defines a pattern for forming an antenna. As will be appreciated, numerous different antenna designs having different shapes and configurations are known and/or are possible, and FIG. 2 shows only one exemplary antenna design and shape.

Figure 3:
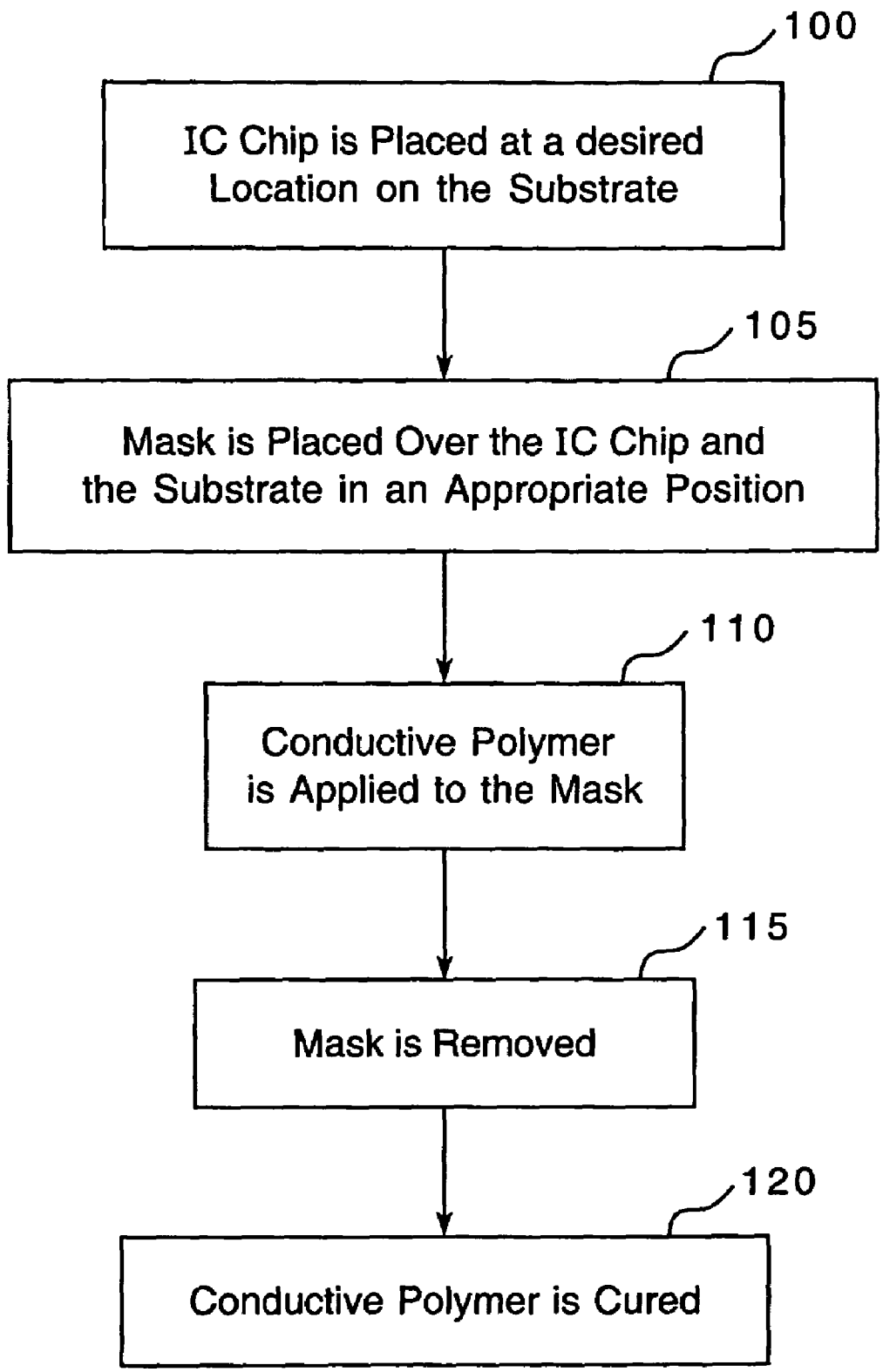
FIG. 3 is a flowchart showing a method of fabricating an antenna and connecting the antenna to an IC chip according to a first embodiment of the present invention.
Figure 4:
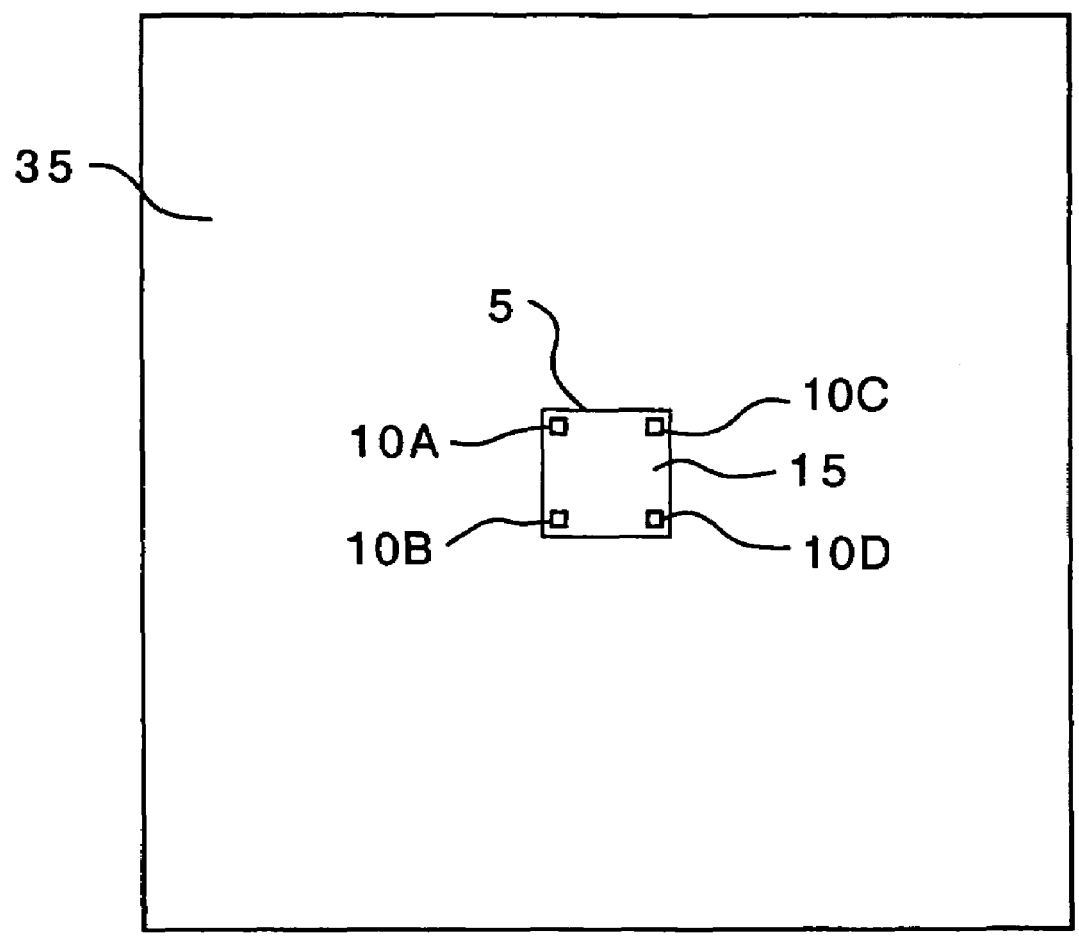
FIG. 4 is a top plan view of the IC chip of FIG. 1 positioned on a substrate according to the method of FIG. 3.
Figure 5:
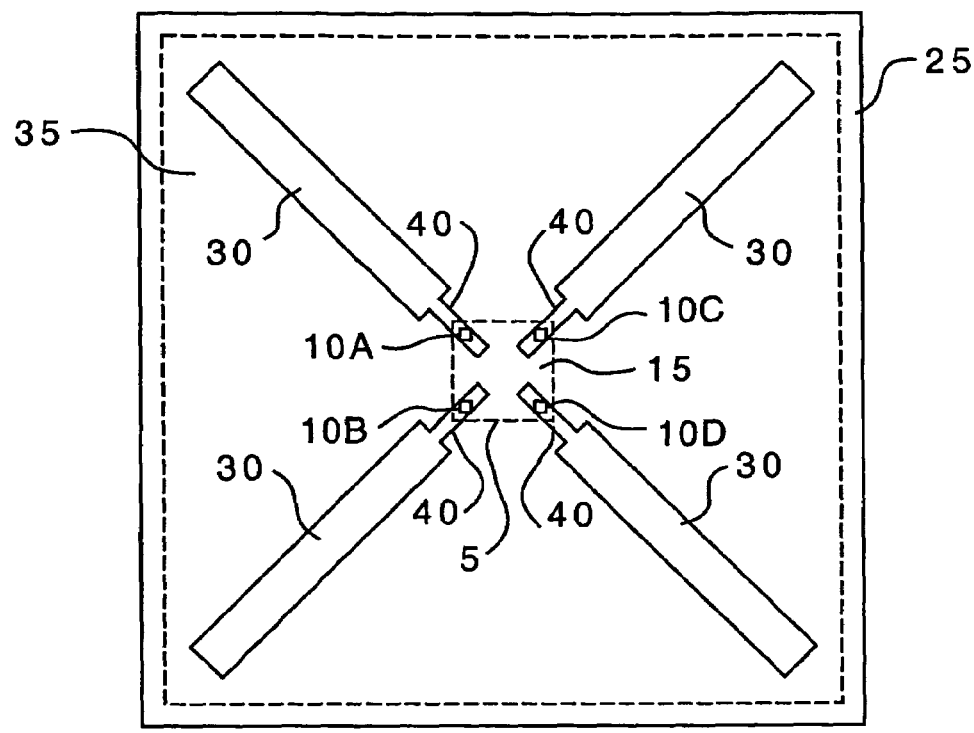
FIG. 5 is a top plan view of the mask of FIG. 2 placed over the IC chip and substrate of FIG. 4.
Figure 6:
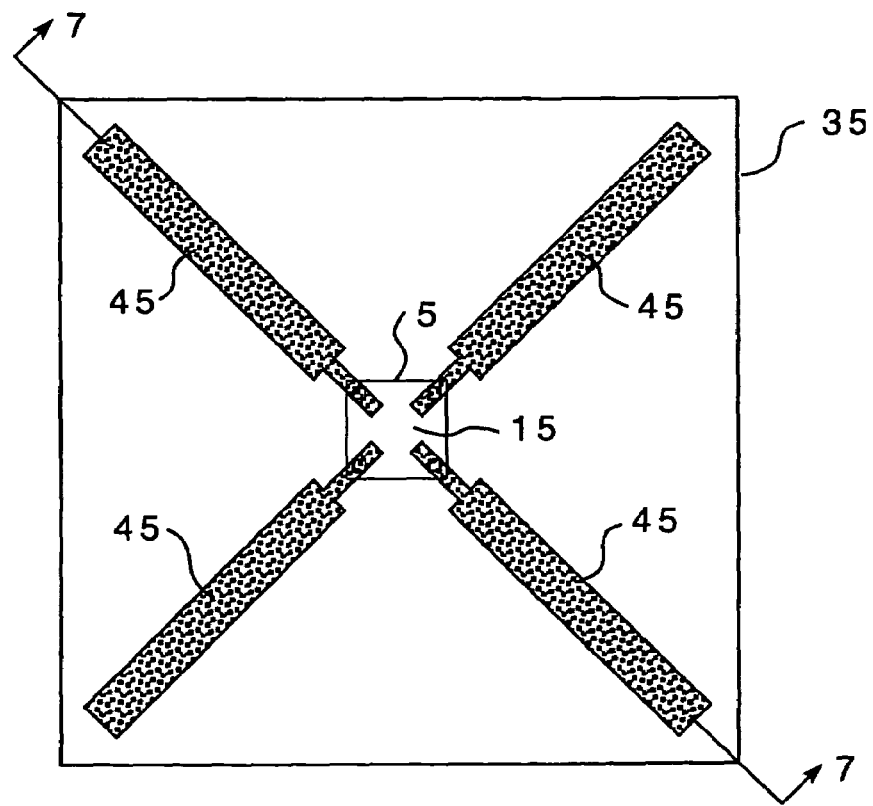
FIG. 6 is a top plan view of a pattern of electrically conductive polymer deposited on the IC chip and substrate of FIG. 4.
Figure 7:
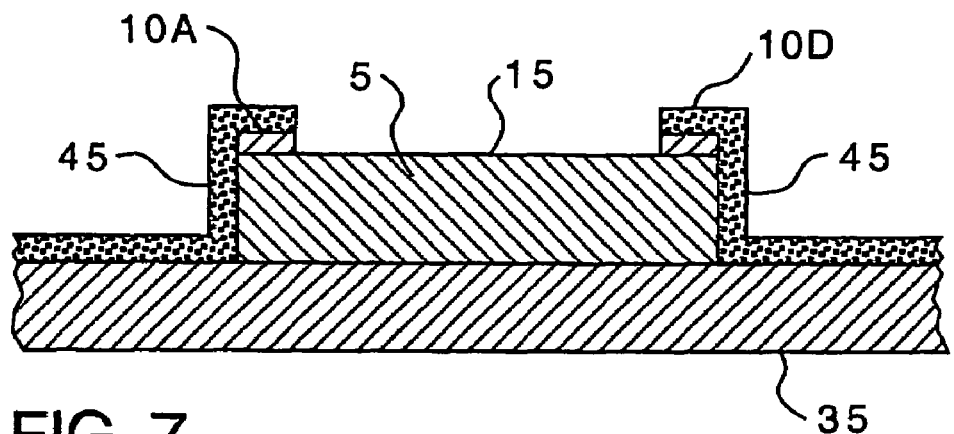
FIG. 7 is a partial cross-section taken along lines 7-7 in FIG. 6.

FIG. 3 is a flowchart showing a method of fabricating an antenna and connecting the antenna to an IC chip such as IC chip 5 according to a first embodiment of the present invention. In step 100, the IC chip 5 is placed at a desired location on a substrate 35 with the pads 10A, 10B, 10C and 10D and the bottom surface 15 facing up (and not against the substrate 35) as shown in FIG. 4. The IC chip 5 may be affixed to the substrate 35, such as with an adhesive, to hold it in place during the remaining steps of the method, or may simply be positioned on the substrate 35 without any other means of affixation thereto. Next, at step 105, the mask 20 is placed over the IC chip 5 and the substrate 35 as shown in FIG. 5. The mask 20 is positioned such that selected portions 40 of the cut-out portion 30 are aligned with and placed over the pads 10A, 10B, 10C and 10D. Next, at step 110, an electrically conductive polymer is applied to the mask 20 by an appropriate method such as, without limitation, spraying or brushing. Step 110 will result in the electrically conductive polymer passing through the mask 20 and being deposited onto the IC chip 5 (and in particular the pads 10A, 10B, 10C, and 10D) and the substrate 35 only at the locations defined by cut-out portion 30. At step 115, the mask 20 is removed as shown in FIG. 6, with the result being a pattern 45 of the electrically conductive polymer being deposited the substrate 35. As described above, the pattern 45 of the electrically conductive polymer forms an antenna. Finally, at step 120, the electrically conductive polymer is cured, such as by heating it or exposing it to the ambient air for a period of time, thereby causing the conductive polymer to adhere to the IC chip 5, and in particular the pads 10A, 10B, 10C, and 10D, and the substrate 35. The electrically conductive polymer will in this manner be electrically connected to the pads 10A, 10B, 10C, and 10D and thus to the internal circuitry of the IC chip 5. Furthermore, the IC chip 5 will be affixed to the substrate 35 and held in place by the electrically conductive polymer. FIG. 7 is a partial cross-sectional view of the IC chip 5, the pattern 45 of electrically conductive polymer, and the substrate 35 taken along lines 7-7 in FIG. 6. As seen in FIG. 7, the electrically conductive polymer is deposited on and adhered to the pads 10A and 10D, the sides of the IC chip 5, and the substrate 35.

Figure 9:
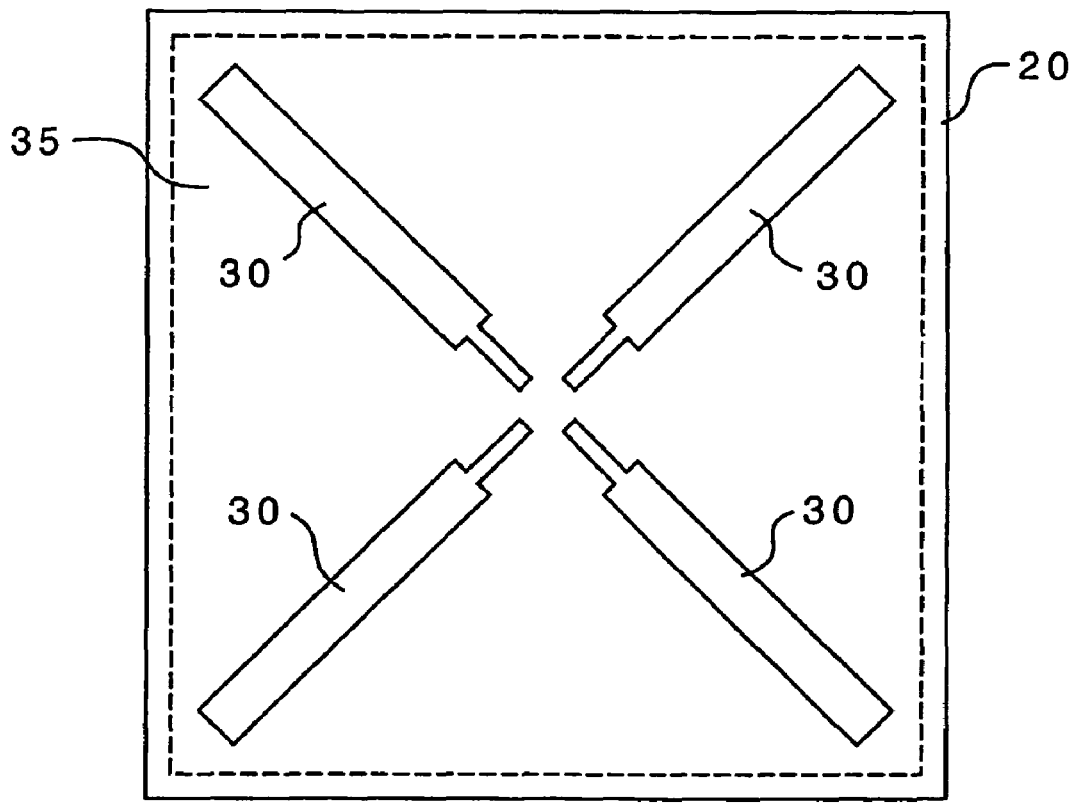
FIG. 9 is a top plan view of the mask of FIG. 2 positioned on a substrate according to the method of FIG. 8.
Figure 8:
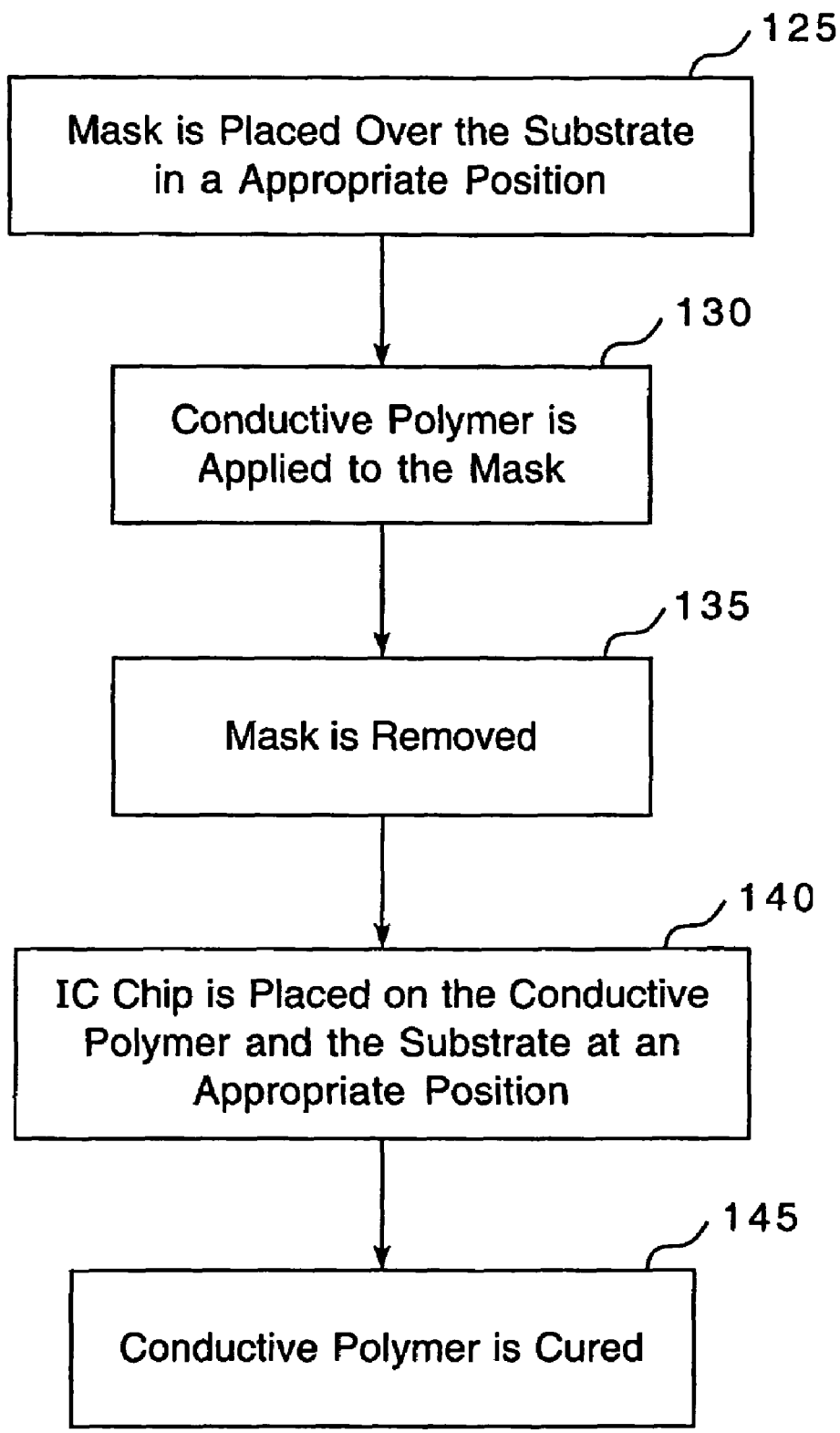
FIG. 8 is a flowchart showing a method of fabricating an antenna and connecting the antenna to an IC chip according to a second embodiment of the present invention.
Figure 10:
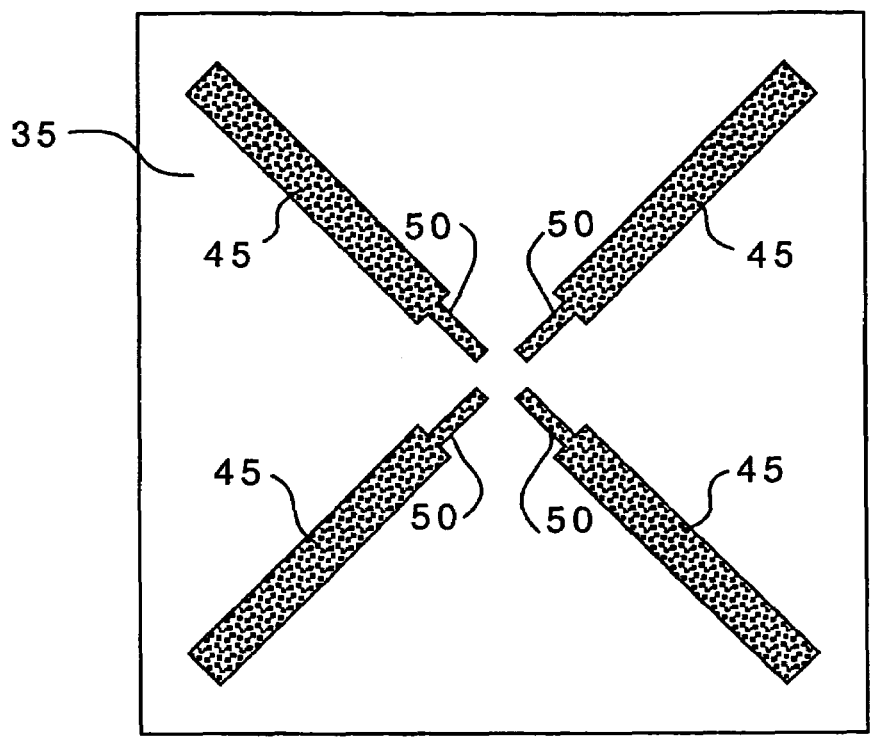
FIG. 10 is a top plan view of a pattern of electrically conductive polymer deposited on the substrate of FIG. 9.
Figure 11:
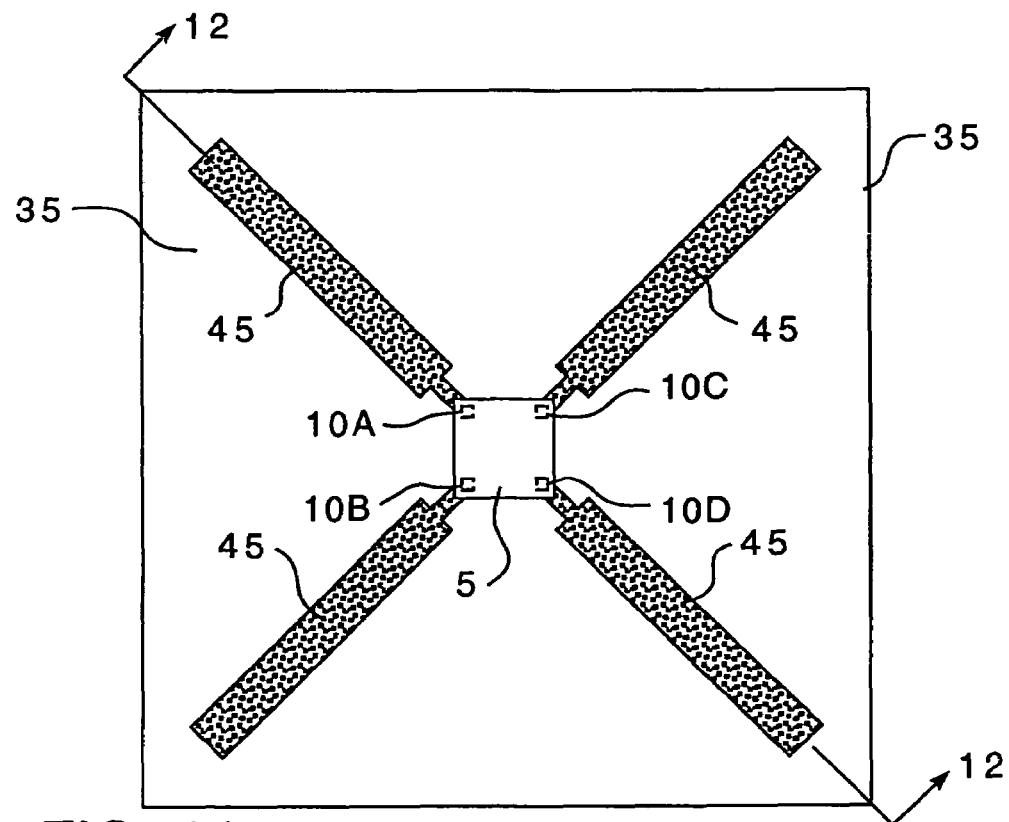
FIG. 11 is a top plan view of the IC chip of FIG. 1 positioned on the pattern of electrically conductive polymer deposited and the substrate of FIG. 10.
Figure 12:
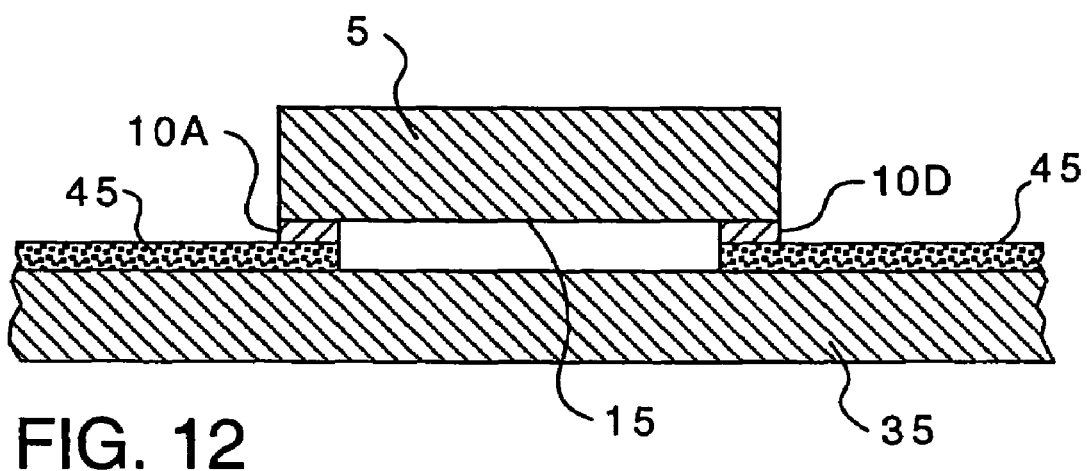
FIG. 12 is a partial cross-section taken along lines 12-12 in FIG. 11.

FIG. 8 is a flowchart showing a method of fabricating an antenna and connecting the antenna to an IC chip such as IC chip 5 according to a second embodiment of the present invention. The method begins at step 125, where the mask 20 is placed over the substrate 35 in an appropriate, desired location as shown in FIG. 9. Next, at step 130, the electrically conductive polymer is applied to the mask 20 by an appropriate method such as, without limitation, spraying or brushing. Step 130 will result in the electrically conductive polymer passing through the mask 20 and being deposited onto the substrate 35 only at the locations defined by cut-out portion 30. At step 135, the mask 20 is removed, with the result being a pattern 45 of the electrically conductive polymer being deposited the substrate 35 as shown in FIG. 10 that, according to an aspect of the present invention, forms an antenna. Next, at step 140, the IC chip 5 is placed on the electrically conductive polymer with the bottom surface 15 thereof facing down against the substrate 35 as seen in FIG. 11. Step 140 is performed before the conductive polymer is cured. Care is taken to position the IC chip 5 such that the pads 10A, 10B, 10C and 10D each contact a respective portion 50 (FIG. 10) of the pattern 45 of electrically conductive polymer. Then, at step 145, the conductive polymer is cured, such as by heating it or exposing it to the ambient air for a period of time, thereby causing the electrically conductive polymer to adhere to the IC chip 5, and in particular the pads 10A, 10B, 10C, and 10D, and the substrate 35. In addition, as was the case with the method shown in FIG. 3, the electrically conductive polymer will in this manner be electrically connected to the pads 10A, 10B, 10C, and 10D and thus to the internal circuitry of the IC chip 5. Furthermore, the IC chip 5 will be affixed to the substrate 35 and held in place by the electrically conductive polymer. FIG. 12 is a partial cross-sectional view of the IC chip 5, the pattern 45 of electrically conductive polymer, and the substrate 35 taken along lines 12-12 in FIG. 11. As seen in FIG. 12, the pads 10A and 10D are positioned on and adhered to the electrically conductive polymer, and the appropriate electrically conductive polymer as described elsewhere herein is deposited on and adhered to substrate 35.

FIGS. 3 and 8 show two particular embodiments of methods for applying the electrically conductive polymer. However, it should be understood that a number of alternative methods may be employed to apply the electrically conductive polymer to either the IC chip 5 and the substrate 35 (as in FIG. 6) or the substrate 35 (as in FIG. 10) before placing the IC chip 5 thereon. For example, the electrically conductive polymer can be applied in a desired pattern using ink jet printing technology (and an ink jet print head), such as continuous or drop-on demand ink jet printing technology. Alternatively, screen printing techniques may be used to apply the electrically conductive polymer. As is known, screen printing uses a screen, made of, for example, a porous fabric or stainless steel mesh, that is stretched tightly over a frame made of wood or metal. A stencil that defines the image to be printed is produced on the screen either manually or photochemically. Screen printing is performed by placing the screen over the object to be printed, placing the print material, in this case the electrically conductive polymer, onto the top of the screen, and forcing the print material through the screen openings using a squeegee that is drawn across the screen. The print material will pass through only in areas where no stencil is applied, thus forming an image on the object to be printed.

Furthermore, as is known, some antenna designs include one or more capacitors or capacitive elements. Typically, such capacitors or capacitive elements are formed on a substrate as part of the antenna structure by providing first and second conductive layers with a layer of a dielectric material, such as $BaTiO_3$, provided therebetween. According to a further aspect of the invention, antennas having capacitors or capacitive elements and electronic components such as RFID tags having such antennas may be fabricated utilizing the principles described herein. Specifically, a first conductive layer made of an electrically conductive polymer may be applied using a first mask, a layer of dielectric material may be applied on top of the first conductive layer using a second mask, and a second conductive layer made of an electrically conductive polymer may be applied on top of the layer of dielectric material using a third mask (the third mask may be the same as the first and/or second mask). The various layers may be applied using either the method of FIG. 3 (on top on the IC chip 5) or the method of FIG. 8 (on the substrate 35 with the IC chip being attached thereafter). In addition, one or more of the layers may be applied using other techniques described herein, such as ink jet printing or screen printing. As will be appreciated, the IC chip 5 may, in this embodiment, be positioned such that one of the pads 10A, 10B, 10C and 10D is connected to the first conductive layer and another of the pads 10A, 10B, 10C and 10D is connected to the second conductive layer. Alternative dielectric materials that may be used include, without limitation, polyester (Mylar) film, combination polyester (Mylar) and polypropylene film, KF (polymer) film, polycarbonate film, Kapton film, polypropylene film, polysulfone film, polystyrene film, supermetallized polypropylene film, supermetallized polypulse film, Teflon film, and paper or Kraft paper film.

Figure 13:
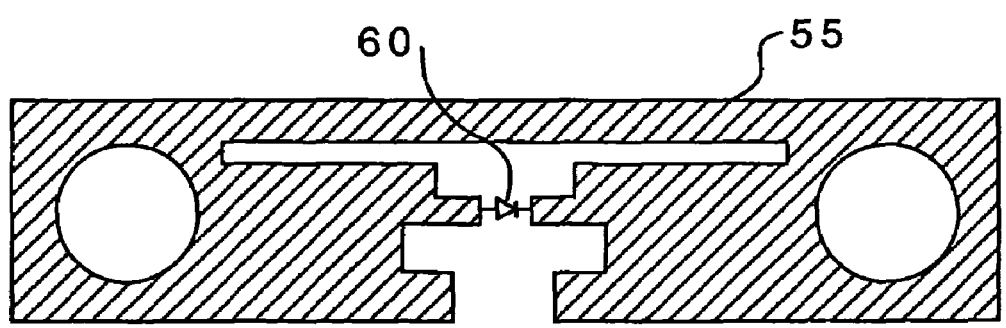
FIG. 13 is a top plan view of a pattern of conductive polymer forming an antenna according to an alternative embodiment of the present invention.

As yet another alternative, the present invention may be used to fabricate an electronic device having an RF antenna coupled to a non-linear device such as a rectifying diode as described in U.S. Patent Application Publication No. 20040189473, owned by the assignee of the present invention, entitled "RFID Radio Frequency Identification Or Property Monitoring Method And Associated Apparatus," the disclosure of which is incorporated herein by reference. In such a device, one or more antennas 55 having the general shape and configuration shown in FIG. 13 may be fabricated and electrically connected to a non-linear device 60 such as a rectifying diode using an electrically conductive polymer as described herein. Furthermore, many conductive polymers, when cured, are flexible, and thus antenna 55 may be fabricated on a flexible substrate such as a non-conducting polymer, plastic, paper, mylar, linen, gauze or a like material.

Figure 14:
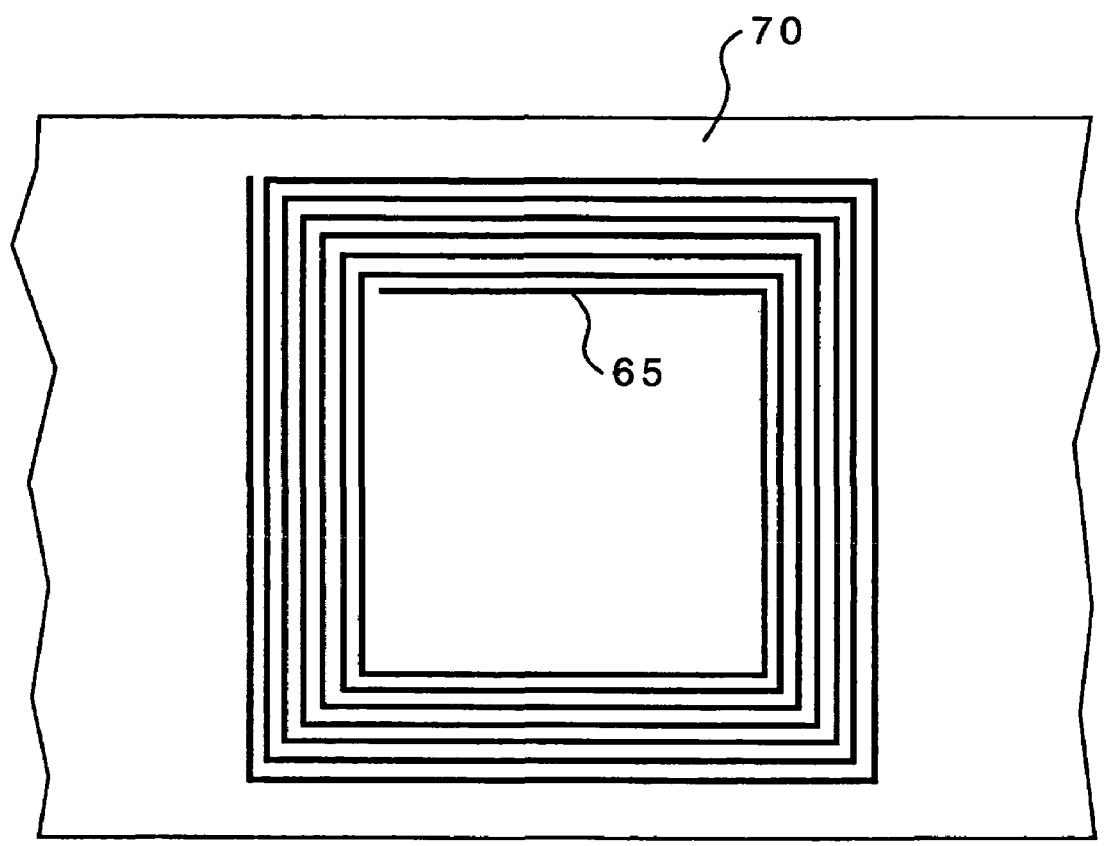
FIG. 14 is a top plan view of a pattern of conductive polymer forming an antenna according to a further alternative embodiment of the present invention.
Figure 15:
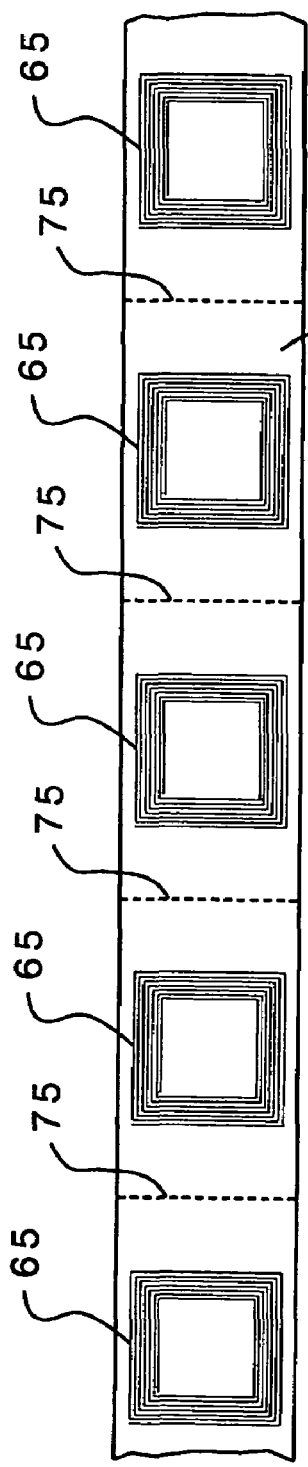
FIG. 15 is a top plan view of a number of antennas as shown in FIG. 14 fabricated on a flexible substrate to form a sheet wherein each portion of the substrate including an antenna may be readily separated.
Figure 16:
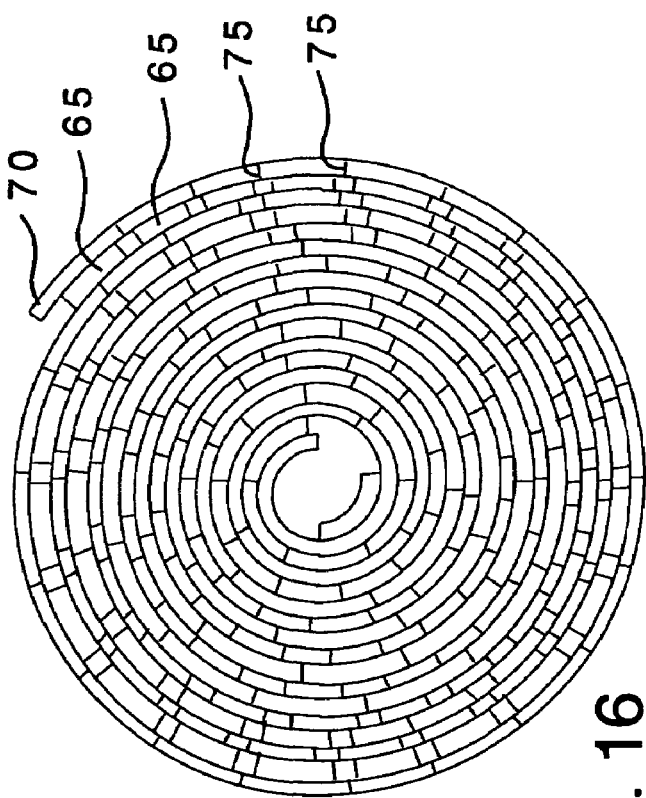
FIG. 16 is a side view of the sheet shown in FIG. 15 in a rolled up condition.

According to yet another aspect of the present invention, it is possible to fabricate antennas made of a conductive polymer having varying, complex shapes using the techniques described herein. For example, a spiral shaped antenna 65 such as the one shown in FIG. 14 may be fabricated on a substrate for use in connection with, for example, an RFID reader. As used herein, the term spiral shall refer to any pattern of a line that winds around a fixed center point, including, without limitation, curved lines and lines having a number of straight segments having an angular relationship with one another. As will be appreciated, a spiral is only one example of a shape that may be utilized, and other shapes, such as, without limitation, those shown in FIGS. 10 and 13, or a dipole, monopole, folded dipole, patch or any other known or hereafter developed one, two or three dimensional antenna configuration, may also be used. A number of such antennas to be fabricated on a flexible substrate 70 to form a sheet as shown in FIG. 15. Due to the flexible nature of the flexible substrate 70 and the conductive polymer, the sheet may then be stored in a rolled up condition, for example in a cylindrical shape, as shown in FIG. 16, much like a roll of paper towels, until one or more of the antennas are used. It will be appreciated that, when rolled up, the sheet may take on any number of other shapes. Preferably, a separating mechanism 75, such as, without limitation, perforations, folds or cut line indications may be provided between each segment of the flexible substrate 70 that includes an antenna 65 to enable them to be separated easily when desired. Alternatively, the segments may be cut apart when desired using a cutting mechanism, such as, for example, a serrated edge like those typically provided with a roll of plastic wrap or aluminum foil used in the home.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the breadth of the claims appended in any and all equivalents thereof.

What is claimed is:

1. A method of making an electronic device, comprising:
   placing an electronic component on a substrate, a first surface of said electronic component contacting a top surface of said substrate, said electronic component having a second surface having one or more electrically conductive contacts, said second surface being opposite said first surface;
   depositing an electrically conductive polymer on at least a portion of said second surface and said substrate in a first pattern, said electrically conductive polymer in said first pattern contacting at least one of said one or more electrically conductive contacts;
   curing said electrically conductive polymer in said first pattern; and
   wherein said electrically conductive polymer in said first pattern forms an antenna.

2. The method according to claim 1, wherein said electronic component is an IC chip.

3. The method according to claim 1, wherein said one or more electrically conductive contacts comprise one or more pads.

4. The method according to claim 1, wherein said depositing step comprises placing a mask over said substrate and said electronic component, said mask having a cut-out portion, said cut-out portion being in substantially the shape of said first pattern, and applying said electrically conductive polymer to said mask to establish said electrically conductive polymer in said first pattern.

5. The method according to claim 1, wherein said depositing step comprises screen printing said electrically conductive polymer in said first pattern.

6. The method according to claim 1, wherein said depositing step comprises printing said electrically conductive polymer in said first pattern using an ink jet print head.

7. The method according to claim 1, wherein said placing step includes affixing said electronic component to said substrate.

8. The method according to claim 1, wherein said electronic device is an RFID tag.

9. The method according to claim 1, wherein said electrical conductive polymer has a sheet resistance of about 1.0 ohm/square or less.

10. The method according to claim 1, wherein said electrical conductive polymer has a sheet resistance of about 0.5 ohm/square or less.

11. The method according to claim 1, wherein said electrical conductive polymer has a sheet resistance in the range of about 1.0 ohm/square to 0.1 ohm/square.

12. The method according to claim 1, wherein said electrical conductive polymer has a sheet resistance in the range of about 0.1 ohm/square to about 0.01 ohm/square.

13. The method according to claim 1, wherein said electrical conductive polymer has a sheet resistance in the range of about 0.01 ohm/square to about 0.001 ohm/square.

14. The method according to claim 1, wherein said electrical conductive polymer has a sheet resistance in the range of about 0.001 ohm/square to about 0.0001 ohm/square.

15. The method according to claim 1, wherein said electrical conductive polymer has a sheet resistance of less than about 0.0001 ohm/square.

16. The method according to claim 1, wherein said electronic component is a non-linear device.

17. The method according to claim 16, wherein said non-linear device is a rectifying diode.

18. A method of making an electronic device, comprising:
placing an electronic component on a substrate, a first surface of said electronic component contacting a top surface of said substrate, said electronic component having a second surface having one or more electrically conductive contacts, said second surface being opposite said first surface;
depositing an electrically conductive polymer on at least a portion of said second surface and said substrate in a first pattern, said electrically conductive polymer in said first pattern contacting at least one of said one or more electrically conductive contacts;
depositing a layer of dielectric material in a second pattern on top of at least a portion of said electrically conductive polymer in said first pattern;
depositing an electrically conductive polymer in a third pattern on top of at least a portion of said layer of dielectric material, said electrically conductive polymer in said third pattern contacting at least one of said one or more electrically conductive contacts; and
curing said electrically conductive polymer in said first pattern and curing said electrically conductive polymer in said third pattern;
wherein said electrically conductive polymer in said first pattern forms an antenna.

19. The method according to claim 18, wherein said second pattern is different from one or both of said first pattern and said third pattern.

20. The method according to claim 18, wherein said first pattern, said second pattern and said third pattern are different from one another.

21. A method of making an electronic device, comprising:
depositing an electrically conductive polymer on at least a portion of a substrate in a first pattern;
placing an electronic component on said substrate, said electronic component having a first surface having one or more electrically conductive contacts, at least one of said one or more electrically conductive contacts contacting a portion of said electrically conductive polymer;
depositing a layer of dielectric material in a second pattern on top of at least a portion of said electrically conductive polymer in said first pattern;
depositing an electrically conductive polymer in a third pattern on top of at least a portion of said layer of dielectric material, at least one of said one or more electrically conductive contacts contacting said electrically conductive polymer in said third pattern; and
curing said electrically conductive polymer in said first pattern and curing said electrically conductive polymer in said third pattern;
wherein said electrically conductive polymer in said first pattern forms an antenna.

22. The method according to claim 21, wherein said electronic component is an IC chip.

23. The method according to claim 21, wherein said one or more electrically conductive contacts comprise one or more pads.

24. The method according to claim 21, wherein said depositing an electrically conductive polymer on at least a portion of a substrate in a first pattern comprises placing a mask over said substrate, said mask having a cut-out portion, said cut-out portion being in said first pattern, and applying said electrically conductive polymer to said mask.

25. The method according to claim 21, wherein said depositing an electrically conductive polymer on at least a portion of a substrate in a first pattern comprises screen printing said electrically conductive polymer in said first pattern.

26. The method according to claim 21, wherein said depositing an electrically conductive polymer on at least a portion of a substrate in a first pattern comprises printing said electrically conductive polymer in said first pattern using an ink jet print head.

27. The method according to claim 21, wherein said second pattern is different than one or both of said first pattern and said third pattern.

28. The method according to claim 21, wherein said first pattern, said second pattern and said third pattern are different than one another.

29. The method according to claim 21, wherein said electronic device is an RFID tag.

30. The method according to claim 21, wherein said electrical conductive polymer has a sheet resistance of about 1.0 ohm/square or less.

31. The method according to claim 21, wherein said electrical conductive polymer has a sheet resistance of about 0.5 ohm/square or less.

32. The method according to claim 21, wherein said electrical conductive polymer has a sheet resistance in the range of about 1.0 ohm/square to 0.1 ohm/square.

33. The method according to claim 21, wherein said electrical conductive polymer has a sheet resistance in the range of about 0.1 ohm/square to about 0.01 ohm/square.

34. The method according to claim 21, wherein said electrical conductive polymer has a sheet resistance in the range of about 0.01 ohm/square to about 0.001 ohm/square.

35. The method according to claim 21, wherein said electrical conductive polymer has a sheet resistance in the range of about 0.001 ohm/square to about 0.0001 ohm/square.

36. The method according to claim 21, wherein said electrical conductive polymer has a sheet resistance of less than about 0.0001 ohm/square.

37. The method according to claim 21, wherein said electronic component is a non-linear device.

38. The method according to claim 37, wherein said non-linear device is a rectifying diode.

* * * * *

UNITED STATES PATENT AND TRADEMARK OFFICE
CERTIFICATE OF CORRECTION

PATENT NO. : 7,722,920 B2  
APPLICATION NO. : 11/430718  
DATED : May 25, 2010  
INVENTOR(S) : Marlin H. Mickle et al.

It is certified that error appears in the above-identified patent and that said Letters Patent is hereby corrected as shown below:

On the Title Pg, Item (57), ABSTRACT, line 10, "such using" should read --such as using--.  
Column 1, line 36, "but is should" should read --but it should--.  
Column 1, line 65, "it's physical area" should read --its physical area--.  
Column 4, line 67, "In another yet another" should read --In yet another--.  
Column 5, line 59, "deposited the substrate" should read --deposited onto the substrate--.  
Column 6, line 23, "deposited the substrate" should read --deposited onto the substrate--.  
Column 8, line 4, "antennas to be" should read --antennas can be--.

Signed and Sealed this

Seventh Day of September, 2010

David J. Kappos  
*Director of the United States Patent and Trademark Office*